(12) United States Patent
Barsun et al.

(10) Patent No.: US 7,198,094 B2
(45) Date of Patent: Apr. 3, 2007

(54) FINNED DEVICE FOR REMOVING HEAT FROM AN ELECTRONIC COMPONENT

(75) Inventors: Stephan Karl Barsun, Davis, CA (US); Andrew Harvey Barr, Roseville, CA (US); Robert William Dobbs, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/600,112

(22) Filed: Jun. 20, 2003

(65) Prior Publication Data

US 2004/0256085 A1 Dec. 23, 2004

(51) Int. Cl.
*F28F 7/00* (2006.01)
*H05K 7/20* (2006.01)

(52) U.S. Cl. ............... 165/80.3; 165/185; 165/122; 165/104.34; 361/697

(58) Field of Classification Search .......... 165/80.3, 165/185, 122, 124, 126, 104.34; 361/690, 361/697, 703, 709, 710, 704; 174/16.3
See application file for complete search history.

(56) References Cited

U.S. PATENT DOCUMENTS

| | | | | |
|---|---|---|---|---|
| 3,592,260 A | * | 7/1971 | Berger | 165/121 |
| 5,077,601 A | * | 12/1991 | Hatada et al. | 257/722 |
| 5,195,576 A | * | 3/1993 | Hatada et al. | 165/80.3 |
| 5,381,859 A | * | 1/1995 | Minakami et al. | 165/80.3 |
| 5,513,071 A | * | 4/1996 | LaViolette et al. | 361/703 |
| 5,546,272 A | * | 8/1996 | Moss et al. | 361/687 |
| 5,582,240 A | * | 12/1996 | Widmayer | 165/80.3 |
| D379,088 S | * | 5/1997 | Hopper | D13/152 |
| 6,061,237 A | * | 5/2000 | Sands et al. | 361/695 |
| 6,179,046 B1 | | 1/2001 | Hwang et al. | |
| 6,313,399 B1 | * | 11/2001 | Suntio et al. | 174/17 VA |
| 6,418,020 B1 | * | 7/2002 | Lin | 361/703 |
| 6,537,019 B1 | * | 3/2003 | Dent | 415/61 |
| 6,697,256 B1 | * | 2/2004 | Horng et al. | 361/704 |
| 2002/0167798 A1 | | 11/2002 | Jui-Yuan | |
| 2003/0196779 A1 | | 10/2003 | Horng et al. | |

\* cited by examiner

*Primary Examiner*—Tho Duong

(57) ABSTRACT

A device for removing heat from an electronic component, comprising a heat sink that can be coupled to the electronic component and conduct heat therefrom. A finned appurtenance coupled to the heat sink can transfer the heat into a fluid medium. The fins are oriented at an angle with respect to several flow streams of the fluid medium across the fins. Each flow stream follows a unique direction.

14 Claims, 5 Drawing Sheets

200

FINNED DEVICE FOR REMOVING HEAT FROM AN ELECTRONIC COMPONENT

FIELD OF THE INVENTION

Embodiments of the present invention relate to the field of cooling electronic devices. Specifically, an embodiment of the present invention relates to a finned device for removing heat from an electronic component.

BACKGROUND OF THE INVENTION

During their operation, electronic devices such as microprocessors, other integrated circuits, and other electronic components produce heat. Sometimes, the amount of heat produced and/or the attributes of the electronic device are such that this heat must be removed from the device. Failure to remove the heat from such devices can cause its operating characteristics to deteriorate. Deterioration of these operating characteristics can cause problems for the systems that incorporate these electronic devices. In some cases, failure to adequately remove the heat can lead to the failure of the device. Such problems can be troublesome and costly.

To prevent such problems from occurring, cooling can be provided to electronic components. One means of cooling electronic components is the heat sink. Heat sinks have long been used to remove heat from electronic devices to which the heat sinks are attached. Heat sinks can comprise a mass of thermally conductive material such as a metal like copper or aluminum. Heat sinks can be attached to the top or another surface of the electronic device to be cooled. Heat produced within the electronic device is transferred by conduction into the heat sink mass. The heat is then transferred away from the heat sink primarily via convection. Some of the heat can also be removed via radiation.

To promote convective heat transfer from them, some heat sinks are designed to include a plurality of fins on their upper surface. The heat is conducted through the heat sink and into the fins. There, the heat radiates off and away from the heat sink. The fins also radiate heat. Fins can comprise an array of plano-linear appendages running parallel to one another across the surface of the heat sink and parallel to the flow of air across them, as shown in Prior Art FIG. 1. Fins can also comprise an array of pins, posts, or similarly configured appendages raised from the surface of the heat sink. Heat transfer from the heat sink via the fins is proportional to the surface area of the fins.

Air (or another gas) filling the interior of the housing of a component or system of which the electronic device being cooled is a part provides a medium for convective heat transfer away from the fins, and thus serves to promote cooling of the device. Convection typically provides a significant portion of the device's cooling. Convective heat transfer is proportional to the mass flow rate of a cooling medium across the heated surface. Thus, convective cooling can be made more effective by providing or increasing the flow of the fluid across the fins. The flow rate can be increased by the use of mechanical ventilating components such as fans.

Some electronic devices are provided with their own dedicated cooling fans, such as those mounted integrally with its heat sink pin fin structure. Electronic systems such as computers and servers, which can incorporate a multitude of heat producing electronic components, sometimes provide cooling media in the form of fan-blown air. The air blowing through the internals of the system removes the heat produced by the components therein. As the air warmed by this heat leaves the system, it carries the heat with it into the room or other milieu in which the system operates. Sometimes this heat is further dissipated, such as by external fans, or removed, such as by air conditioning and ventilation.

For some electronic systems such as enterprise servers and other business-critical systems, operational reliability is an significant if not crucial attribute. Where operational reliability is necessary, cooling of component devices is such an important function that multiple fans are used therein for redundancy. As shown in Prior Art FIG. 1, redundant fans 11 and 12 are conventionally mounted coaxially so that during normal operations, the first fan 11 discharges its air into the suction of the second fan 12. This arrangement provides more than adequate air flow 16 from one direction across heat sink 13, parallel to its fin appurtenances 15, so as to cool electronic device 14 by forced convection.

The output volume, pressure, and mass flow rate of the discharge of a single fan, either 11 or 12, is designed to suffice to adequately cool device 14. Thus fans 11 and 12 are redundant; if fan 11 fails, fan 12 should suffice and vice versa. However, a frequent failure mode for fans used in cooling electronic equipment is bearing failure. Typically, such bearing failures occur when a bearing seizes, which can stop (or initially slow and progress to stop) the rotation of the fan. Blades 20 of fans 11 and 12 do not feather, but retain their pitch. Thus if either fan stops by bearing seizure, blades 20 of the stopped fan are static in the airstream and can aerodynamically impede the air flow from the redundant fan.

In such a case, the redundant fan can provide less than its design air discharge, such that air flow 15 can be reduced to less than half of the design discharge of both operating fans. When air flow 15 is thus reduced, it may not provide adequate cooling for electronic device 14, and the purpose of having the redundant fans can be impeded or defeated.

Other heat sink designs such as pin finned heat sinks allow cooling from any direction or from multiple directions. However, pin fin and other such heat sinks are less efficient than plano-linearly finned heat sinks in both heat transfer and pressure drop. Other methods of cooling electronic devices besides heat sinks have been implemented to avoid these shortcomings. These solutions include heat pipes and vapor chambers. However, both heat pipes and vapor chambers are typically expensive with respect to heat sinks, and have their own reliability issues, such as leakage failure.

Further, fans (including redundant pairs) are sometimes used with the heat pipes and vapor chambers to remove the heat therefrom, such that cooling reliability can remain a concern even when these alternatives are used. Adding additional fans to systems whose components are cooled by either heat sinks or alternatives can be expensive and pose spatial and physical arrangement challenges within the systems. This can be exacerbated by the placement of components such as power supplies and circuit boards. These can restrict or block air flow add more heat. Hence, conventional solutions to removing heat from electronic devices may not be entirely adequate in some applications.

SUMMARY OF THE INVENTION

A device for removing heat from an electronic component is disclosed. The device comprises a heat sink adapted to couple to the electronic component and conduct heat therefrom. A finned appurtenance is coupled to the heat sink and adapted to transfer the heat into a fluid medium. The fins are oriented at an angle with respect to a plurality of flow streams of the fluid medium across the fins. Each flow stream follows a unique direction.

BRIEF DESCRIPTION OF THE DRAWINGS

Prior Art

DETAILED DESCRIPTION OF THE INVENTION

Figure 1:
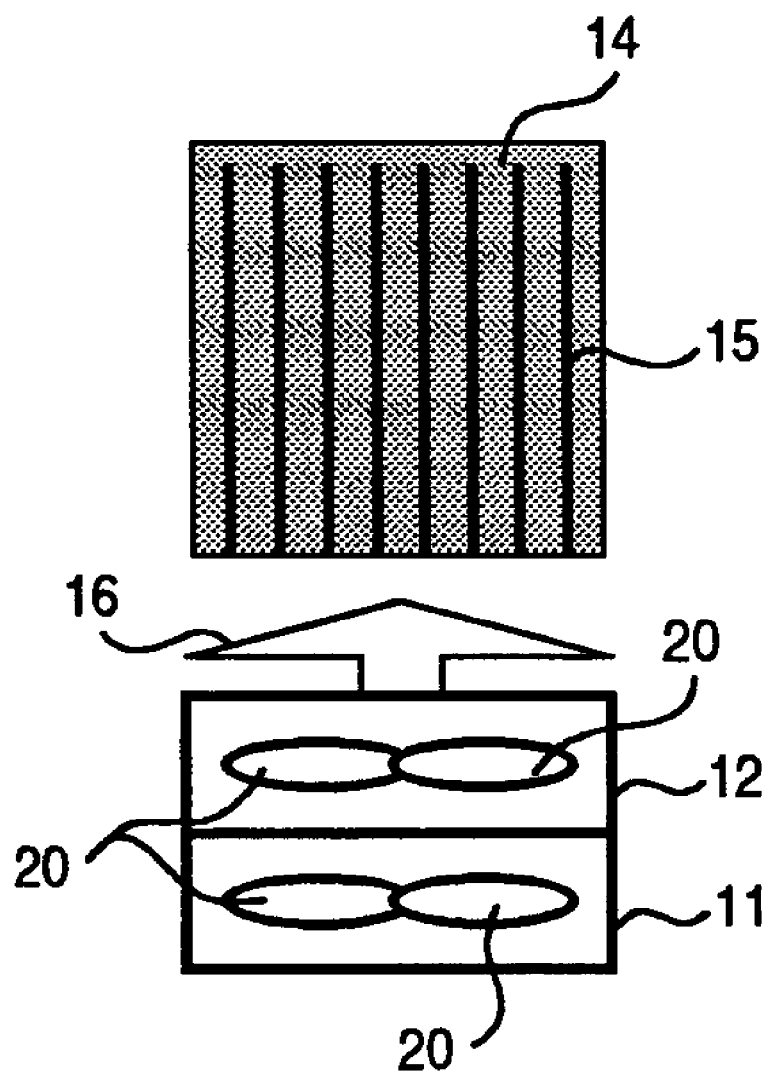
FIG. 1 depicts a conventional plano-linear heat sink fin appurtenance cooled by dual coaxial fans.

A finned device for removing heat from an electronic component is disclosed. Reference will now be made in detail to embodiments of the invention, examples of which are illustrated in the accompanying drawings. While the invention will be described in conjunction with these embodiments, they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. However, it will be apparent to one of ordinary skill in the art that the present invention may be practiced without these specific details. In other instances, well known methods, procedures, and components have not been described in detail so as not to unnecessarily obscure aspects of the present invention.

A device for removing heat from an electronic component is disclosed. The device comprises a heat sink adapted to couple to the electronic component and conduct heat therefrom. A finned appurtenance is coupled to the heat sink and adapted to transfer the heat into a fluid medium. The fins are oriented at an angle with respect to a plurality of flow streams of the fluid medium across the fins. Each flow stream follows a unique direction. In one embodiment, the fins comprising the finned appurtenance are plano-linear in shape and parallel to each other but oriented at an angle with respect to several flow streams of a cooling fluid medium.

In one embodiment, the fins comprising the finned appurtenance are curved and gradually change the directions of flow streams of the cooling medium. One embodiment uses a pair of fans the discharges of which provide the flow streams; the fans mounted such that their discharges are perpendicular to each other as they approach the finned appurtenance. Other embodiments use fans mounted such that their discharges form acute angles with respect to each other as they approach the finned appurtenance. In one such embodiment utilizing plano-linear fins, the fins are oriented at an obtuse angle with respect to the flow stream as it approaches the finned appurtenance.

Embodiments of the present invention allow an electronic component to be cooled from multiple directions. For instance, two flow streams of a cooling medium such as fan blown air can each be directed towards the electronic component's heat sink having a finned appurtenance from different angles. Thus, additional redundancy is possible because two fans can be used to efficiently cool a component; if one fan fails, the other fan will still provide adequate cooling medium flow over the finned appurtenance to remove heat from the component. The conventionally typical coaxially aligned cooling fans can be dispensed with in favor of fans mounted non-coaxially. This allows more efficient N+1 cooling and promotes redundancy to prevent cooling failure in the event of a single fan seizure while advantageously eliminating the conventional need for one fan to overcome the aerodynamic resistance of the seized fan.

Figure 5:
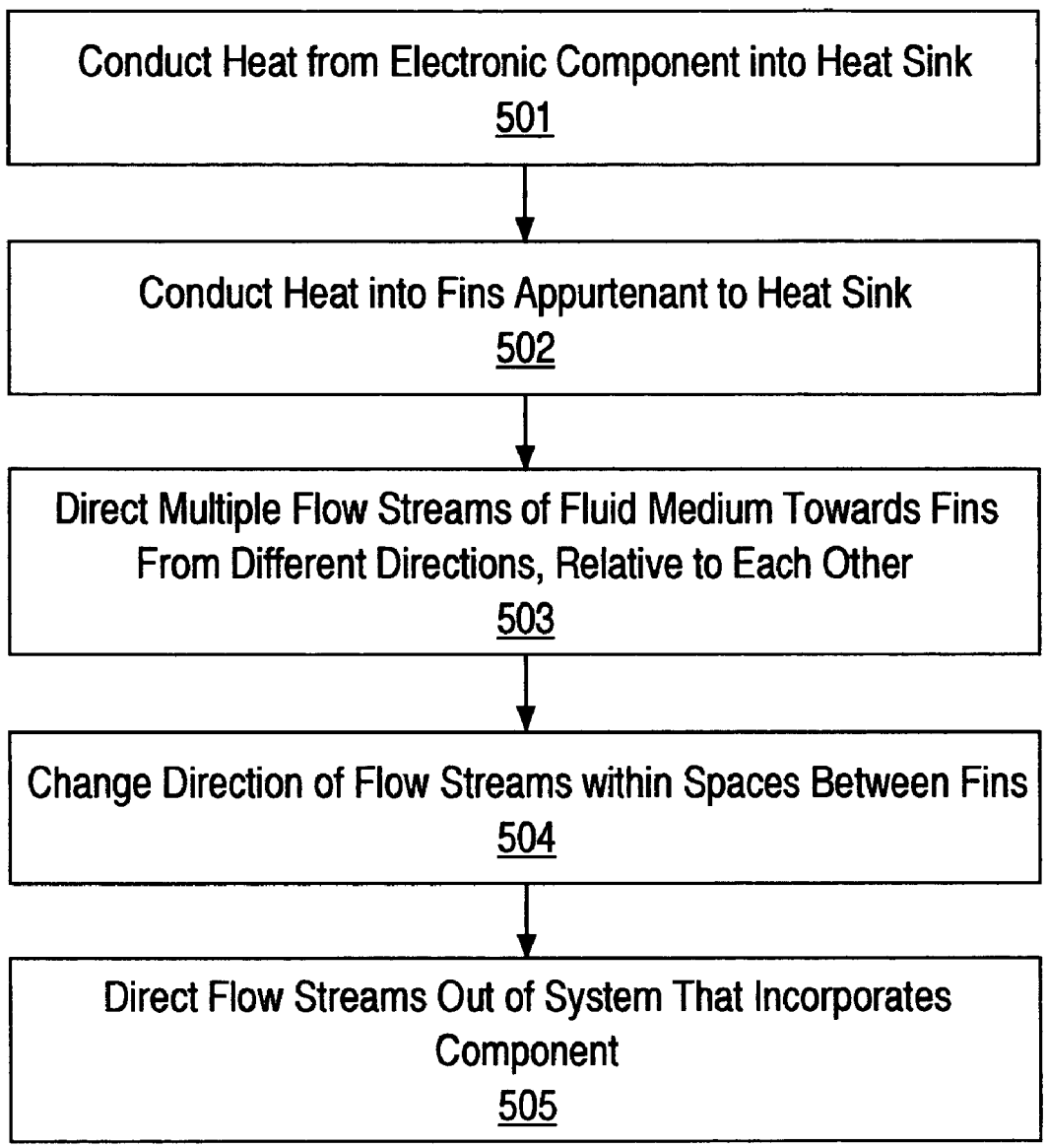
FIG. 5 is a flowchart describing a method for removing heat from an electronic component using a heat sink fin appurtenance, in accordance with an embodiment of the present invention.

Certain portions of the detailed descriptions of embodiments of the invention, which follow, are presented in terms of processes (e.g., methods such as process 500 of FIG. 5). Although specific steps are disclosed in such figures herein describing the operations of these processes and methods, such steps are exemplary. That is, embodiments of the present invention are well suited to performing various other steps or variations of the steps recited in the flowcharts of the figures herein.

Figure 2:
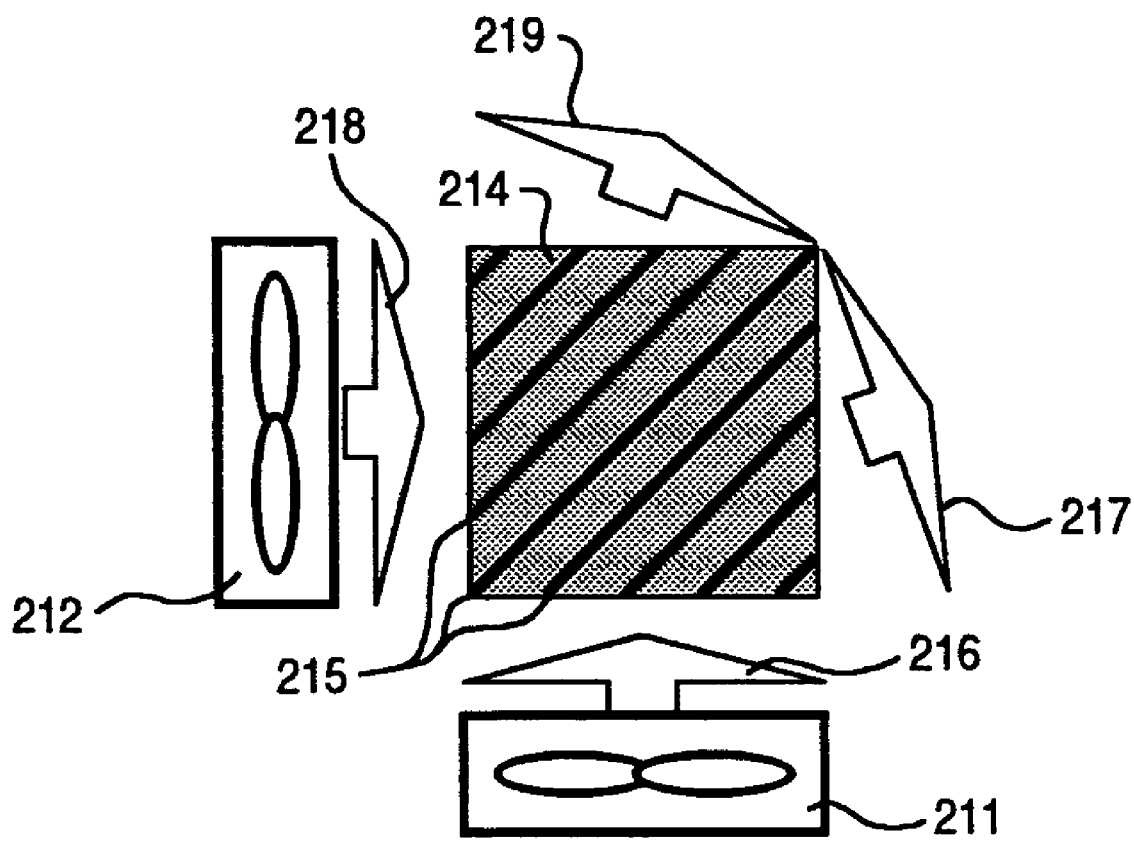
FIG. 2 depicts an angled heat sink fin appurtenance cooled by perpendicular air streams from two fans arranged at right angles to each other, in accordance with an embodiment of the present invention.

Embodiments of the present invention are discussed primarily in the context of a finned device for removing heat from an electronic component. With reference to FIG. 2, a cooling configuration 200 is depicted for an electronic device coupled to a heat sink with finned appurtenance 214 according to one embodiment of the present invention. Fins 215 of heat sink 214 are substantially piano-linear in shape and parallel to each other, as shown in FIG. 2. While FIG. 2 depicts a view directed towards the top surface of the fins 215, it is appreciated that cooling configuration 200 can be mounted within a system, enclosure, or upon a circuit board or other structure in any orientation, such that the upper surface of fins 215 may be directed in any position (e.g., up, down, sideward, etc.) with respect to the system, etc.

Fans 211 and 212 provide locomotion to a cooling medium which can be any gaseous fluid such as air. In the present embodiment, fans 211 and 212 are mounted such that their discharges form cooling medium flow streams 216 and 218, respectively, which approach fins 215 from directions substantially orthogonal to each other. As flow streams 216 and 218 impinge cooling fins 215 and flow through the spaces between them, the air comprising the flow streams is warmed, removing heat from heat sink 214 by forced convection.

As flow stream 216 impinges fins 215 and flows through the spaces between them, its direction is mechanically changed. Warmed flow stream 217 thus emerges from fins 215 in a direction different from the original flow direction of flow stream 216. Likewise, as flow stream 218 impinges fins 215 and flows through the spaces between them, its direction is mechanically changed also. Warmed flow stream 219 thus emerges from fins 215 in a direction different from the original approach direction of flow stream 218.

Figure 3:
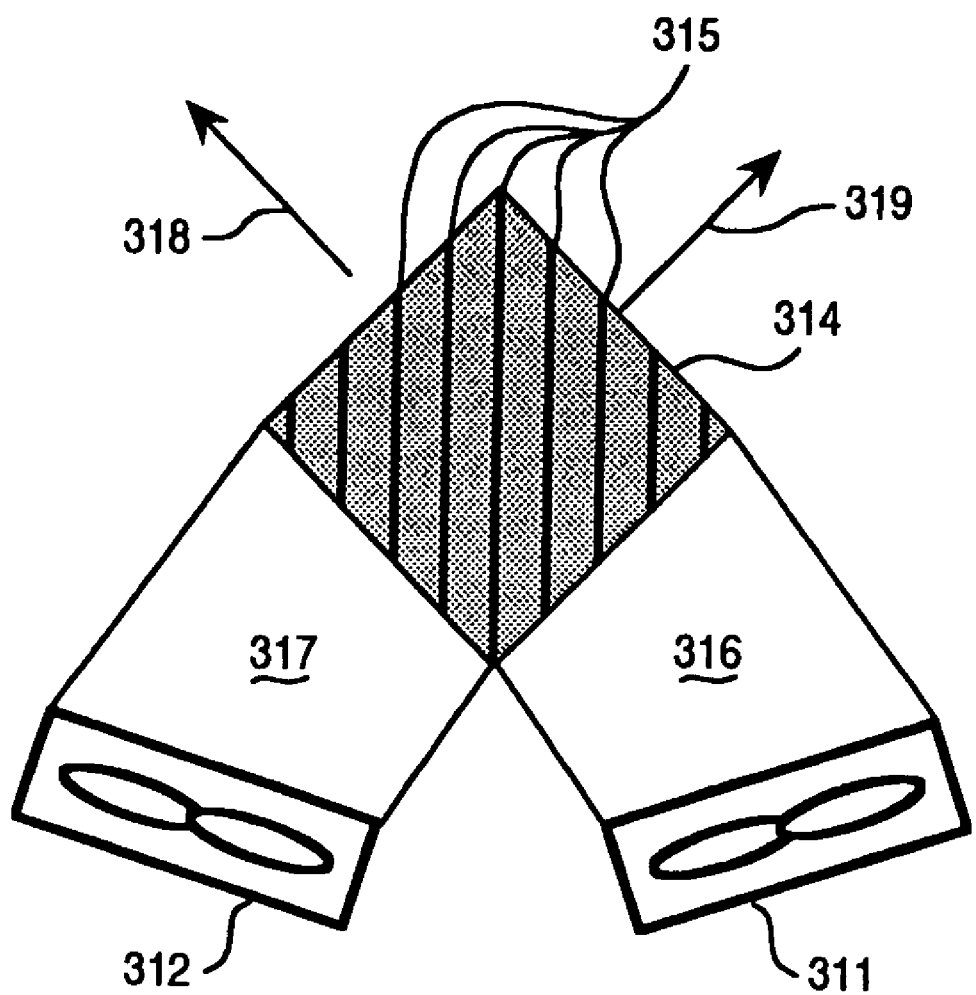
FIG. 3 depicts an angled heat sink fin appurtenance cooled by air streams from two fans arranged at a non-right angle with respect to each other, in accordance with an embodiment of the present invention.

Heat sink 214 and finned appurtenance 215, like other heat sinks and finned appurtenances discussed herein (e.g., comprising cooling configurations 300, 400; FIG. 3, 4, respectively) can comprise a integral package of any heat conducting material such as metal like copper or aluminum or a non-metallic material like carbon. Such an integral unit can be formed by any technique known in the art, such as extrusion, forging, stamping, or the like. Cooling configuration 200, like other cooling configurations discussed herein (e.g., comprising cooling configurations 300, 400; FIG. 3, 4) can be effectively applied in electronic systems such as enterprise servers and other business-critical systems where operational reliability is an significant if not crucial attribute. However, these cooling configurations can be applied economically to cool electronic components in any electronic server; the cost of their components can be on par with the cost of cooling configurations using conventional components.

The fans providing locomotion to the cooling medium do not have to be orthogonal to each other, as depicted in FIG. 2. With reference to FIG. 3, a cooling configuration 300 is depicted, according to one embodiment of the present invention. Advantageously, such an arrangement can allow more internal design and spatial flexibility. In cooling configuration 300, the discharge of fans 311 and 312 provide flow streams of cooling air 316 and 317, respectively, which approach a heat sink 314 of an electronic component to be cooled from an acute angle with respect to each other. As flow streams 316 and 317 impinge cooling fins 315 and flow through the spaces between them, the air comprising the flow streams is warmed, removing heat from heat sink 314 by forced convection.

As flow stream 316 impinges fins 215 and flows through the spaces between them, its direction is mechanically changed. Warmed flow stream 319 thus emerges from fins 315 in a direction different from the original flow direction of flow stream 316. Likewise, as flow stream 317 impinges fins 315 and flows through the spaces between them, its direction is mechanically changed also. Warmed flow stream 318 thus emerges from fins 315 in a direction different from the original approach direction of flow stream 318. As is shown in FIG. 3, fins 315 are, in the present embodiment, oriented in an aspect comprising a substantially obtuse angle (e.g., 135 degrees, etc.) from each flow stream. As with the fins shown in FIGS. 2 and 4, most of the spaces between fins 315 are shown in FIG. 3 to be substantially even.

Figure 4:
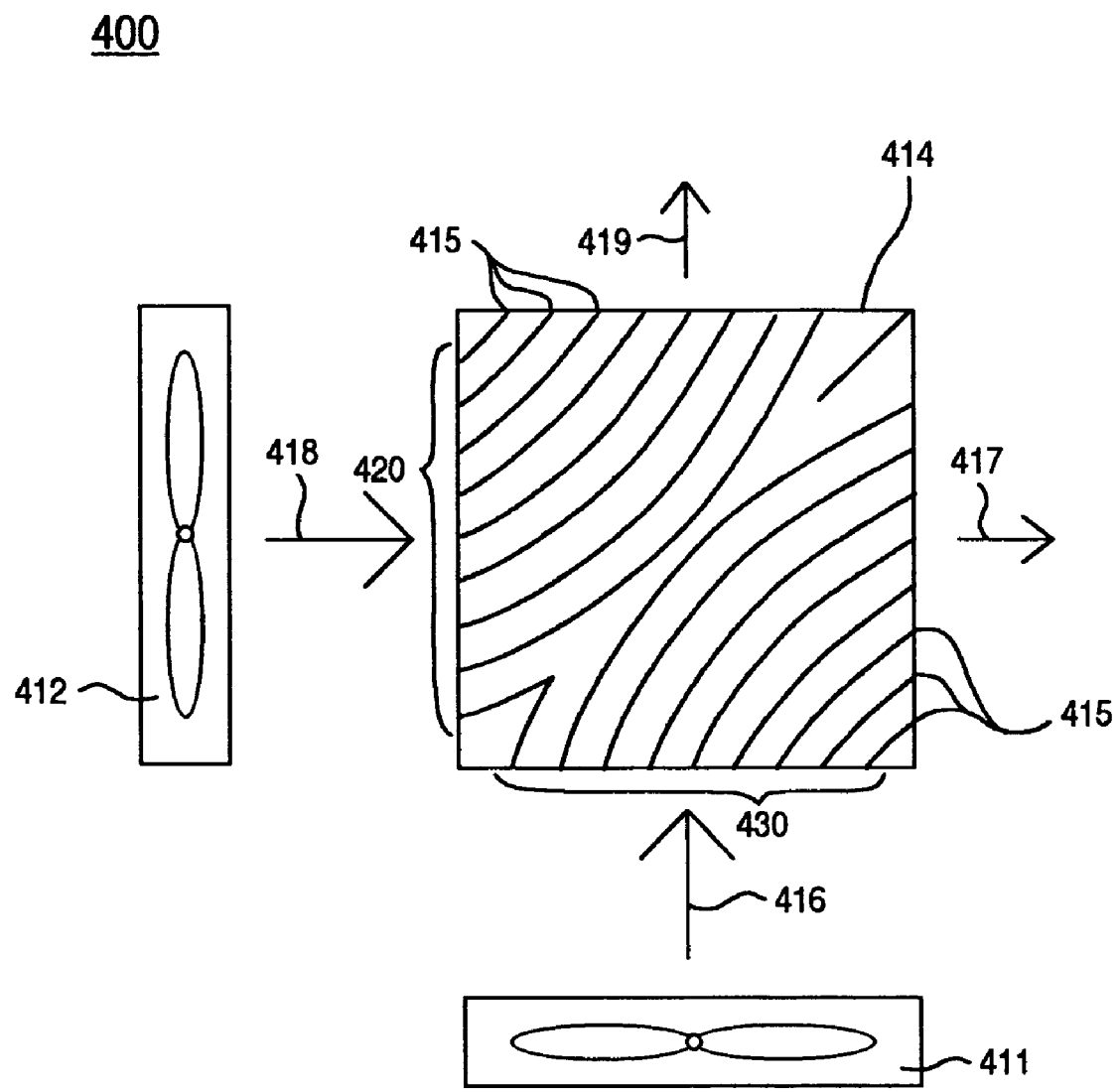
FIG. 4 depicts a curved heat sink fin appurtenance cooled by two fans arranged at a non-right angle with respect to each other, in accordance with an embodiment of the present invention.

In one embodiment of the present invention, the fins are not plano-linear in shape and are not affixed parallel to each other on the finned appurtenance. This can advantageously take advantage of the airflow directions and duct more airflow over the heatsink to better cool its designated electronic component. For instance, FIG. 4 depicts a cooling configuration 400.

Cooling configuration 400 comprises a heat sink 414 having a finned appurtenance the fins 415 of which are curved, in accordance with one embodiment of the present invention. Fins 415 are grouped into two sets 420 and 430. Within each set, fins 415 are arrayed concentrically. However, the curvature of sets 420 and 430 are concentric opposite with respect to each other.

Fans 411 and 412 provide locomotion to a cooling medium which can be any gaseous fluid such as air. In the present embodiment, fans 411 and 412 are mounted such that their discharges form cooling medium flow streams 416 and 418, respectively, which approach fins 415 from directions substantially orthogonal to each other. In another embodiment, the fans are arranged at angles other than orthogonal to each other. Advantageously, such an arrangement can allow more internal design and spatial flexibility. As flow streams 416 and 418 impinge cooling fins 415 and flow through the spaces between them, the air comprising the flow streams is warmed, removing heat from heat sink 414 by forced convection.

As flow stream 416 impinges the fins 415 comprising set 430 and flows through the spaces between them, its direction is mechanically changed, albeit gradually, relative to embodiments described herein having plano-linear shaped fins. Warmed flow stream 417 thus emerges from the fins 415 comprising set 430 in a direction different from the original flow direction of flow stream 416. Likewise, as flow stream 418 impinges the fins 415 comprising set 420 and flows through the spaces between them, its direction is mechanically changed, also gradually. Warmed flow stream 419 thus emerges from fins 415 in a direction different from the original approach direction of flow stream 418.

The fans providing locomotion to the cooling medium do not have to be orthogonal to each other, as depicted in FIG. 4. In another embodiment, the fans can be at other than substantially right angles to each other. Advantageously, such an arrangement can allow more internal design and spatial flexibility.

FIG. 5 depicts a process 500 for removing heat from an electronic component using a heat sink fin appurtenance, in accordance with an embodiment of the present invention. Process 500 begins with step 501, wherein heat is conducted from the electronic component into the heat sink. In step 502, the heat is conducted into fins appurtenant to the heat sink.

In step 503, multiple flow streams of a medium comprising a cooling fluid (e.g., a gas such as air) are directed towards the fins from different directions, relative to each other.

In step 504, the direction of each flow stream is changed within the spaces between the fins. Thus, each respective flow stream, warmed by removing heat from the heat sink via its fins, exits the fin array from a direction different from which it entered.

In step 505, the flow stream is directed out of the system or enclosure incorporating the electronic component being cooled, completing process 500. The air can be directed out of the system by an exhaust fan, positive pressure supplied by a main intake fan, a combination, or any technique known in the art, Advantageously, system air flow, along with the flow streams directed by the fans discussed in other embodiments discussed herein (e.g., cooling configurations 200, 300, 400; FIG. 2, 3, 4, respectively) can promote front-to-back airflow for efficient cooling.

As shown in FIGS. 2, 3 and 4, blocks 503 and 504 allow process 500 to provide a method for removing heat from an electronic component that includes directing multiple flow streams of a fluid medium (e.g., air) in unique directions with respect to each other towards first ends of at least two sets of multiple fins of an appurtenance coupled to a heat sink and disposed to conduct heat from the electronic component. These directions change within the substantially even spaces between the fins towards a second end of the sets of fins, which is opposite from the first end. As shown in FIGS. 2, 3 and 4, the flow streams receive motive force from multiple fans, comprising as they do the discharges of the fans, which are disposed and direct their discharges in the unique directions substantially horizontally with respect to the first end of the fins and into the spaces between them.

An embodiment of the present invention, a finned device for removing heat from an electronic component, is thus described. While the present invention has been described in particular embodiments, it should be appreciated that the present invention should not be construed as limited by such embodiments, but rather construed according to the following claims and their equivalents.

What is claimed is:

1. A device for removing heat from an electronic component, comprising:

a heat sink adapted to couple to said electronic component and conduct heat there from; and an appurtenance having a plurality of fins coupled to said heat sink and adapted to transfer said heat into a fluid medium, said fins oriented at an angle with respect to a plurality of flow streams of said fluid medium, wherein spaces between said fins are substantially even and said flow streams flow in unique directions from a first end of at least two separate sets of said fins towards a second end opposite from said first end;

wherein a first fan and a second fan are substantially orthogonal with respect to one another and direct at least a first flow stream and a second flow stream in said unique directions substantially horizontally with respect to said first end into said spaces to provide a motive force to said flow streams.

2. The device as recited in claim 1 wherein said fins comprise a substantially curved shape.

3. The device as recited in claim 1 wherein said appurtenance comprises an integral part of said heat sink.

4. The device as recited in claim 1 wherein each said flow stream of said plurality is oriented substantially orthogonal to each other said flow stream of said plurality.

5. The device as recited in claim 4 wherein said fins are oriented in an aspect comprising a substantially obtuse angle from each said flow stream.

6. The device as recited in claim 1 wherein said fins function to change each said unique direction.

7. A device for removing heat from an electronic component, comprising:

a heat sink adapted to couple to said electronic component and conduct heat there from; and an appurtenance having a plurality of curved fins coupled to said heat sink and adapted to transfer said heat into a fluid medium and to gradually change unique directions of a plurality of flow streams of said fluid medium from a first end of at least two separate sets of said fins along a curved contour thereof towards a second end opposite from said first end in substantially even spaces between said fins;

wherein a first fan and a second fan are substantially orthogonal with respect to one another and direct at least a first flow stream and a second flow stream in said unique directions substantially horizontally with respect to said first end into said spaces to provide a motive force to said flow streams.

8. The device as recited in claim 7 wherein said appurtenance comprises an integral part of said heat sink.

9. The device as recited in claim 7 wherein each said flow stream of said plurality is oriented substantially orthogonal to each other said flow stream of said plurality.

10. The device as recited in claim 7 wherein said fins function to effect a change in each said unique direction and wherein said change comprises a gradual change.

11. A method for removing heat from an electronic component, comprising:

directing a plurality of flow streams of a fluid medium in unique directions with respect to each other towards first ends of at least two sets of a plurality of fins of an appurtenance coupled to a heat sink and disposed to conduct heat from said electronic component; and changing said direction within substantially even spaces between said fins towards a second end of said sets of fins opposite from said first end, wherein said flow streams receive motive force from at least a first fan and a second fan, wherein said first fan and said second fan are substantially orthogonal with respect to one another and direct at least a first flow stream and a second flow stream in said unique directions substantially horizontally with respect to said first end into said spaces to provide said motive force to said flow streams.

12. The method as recited in claim 11, wherein said fins are oriented in an aspect comprising a substantially obtuse angle from each said flow stream.

13. The method as recited in claim 11 wherein said fins comprise a substantially curved shape and wherein said changing is performed gradually.

14. The method as recited in claim 13 wherein each said flow stream of said plurality is oriented substantially orthogonal to each other said flow stream of said plurality.

* * * * *